US012666588B2

(12) United States Patent
Liu

(10) Patent No.: US 12,666,588 B2
(45) Date of Patent: Jun. 23, 2026

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei City (CN)

(72) Inventor: Youming Liu, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 663 days.

(21) Appl. No.: 18/163,135

(22) Filed: Feb. 1, 2023

(65) Prior Publication Data

US 2023/0389261 A1 Nov. 30, 2023

(30) Foreign Application Priority Data

May 24, 2022 (CN) .......................... 202210568100.9

(51) Int. Cl.
*H10B 12/00* (2023.01)
(52) U.S. Cl.
CPC .................................... *H10B 12/00* (2023.02)
(58) Field of Classification Search
CPC ................................ H10B 12/00; H10B 12/01
See application file for complete search history.

(56) References Cited

U.S. PATENT DOCUMENTS

| | | | | |
|---|---|---|---|---|
| 11,825,642 B1 * | 11/2023 | Dai | ......................... | H10B 12/05 |
| 11,917,805 B2 * | 2/2024 | Lee | ......................... | H10B 12/00 |

FOREIGN PATENT DOCUMENTS

| | | | | | |
|---|---|---|---|---|---|
| CN | 115346987 B | * | 1/2023 | ............. | H10B 12/00 |
| CN | 116347889 A | * | 6/2023 | ............. | H10B 12/00 |
| WO | WO-2024188307 A1 | * | 9/2024 | ............. | H10B 12/01 |

* cited by examiner

*Primary Examiner* — Edward Chin
(74) *Attorney, Agent, or Firm* — Syncoda LLC; Feng Ma

(57) ABSTRACT

A semiconductor structure and a method for forming the same are provided. The semiconductor structure includes a substrate, a switching transistor and a storage transistor. The switching transistor includes a first gate electrode, a first channel layer coating a portion of the first gate electrode, and a first source-drain electrode and a second source-drain electrode both covering a surface of the first channel layer. The storage transistor includes a second gate electrode, a second channel layer coating a portion of the second gate electrode, and a third source-drain electrode and a fourth source-drain electrode both covering a surface of the second channel layer. A portion of the second gate electrode extending out of the second channel layer in a first direction is electrically connected to the second source-drain electrode. The storage transistor is configured to store charge.

7 Claims, 11 Drawing Sheets

A substrate is provided    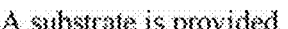 S51

A switching transistor and a storage transistor are formed on a top surface of the substrate. The switching transistor includes a first gate electrode, a first channel layer coating a portion of the first gate electrode, and a first source-drain electrode and a second source-drain electrode both covering a surface of the first channel layer. The first source-drain electrode and the second source-drain electrode are distributed at two opposite ends of the first channel layer in a first direction. The storage transistor includes a second gate electrode, a second channel layer coating a portion of the second gate electrode, and a third source-drain electrode and a fourth source-drain electrode both covering a surface of the second channel layer. The third source-drain electrode and the fourth source-drain electrode are distributed at two opposite ends of the second channel layer in the first direction. A portion of the second gate electrode extending out of the second channel layer in the first direction is electrically connected to the second source-drain electrode. The storage transistor is configured to store charge. The first direction is a direction parallel to the top surface of the substrate    S52

FIG. 5

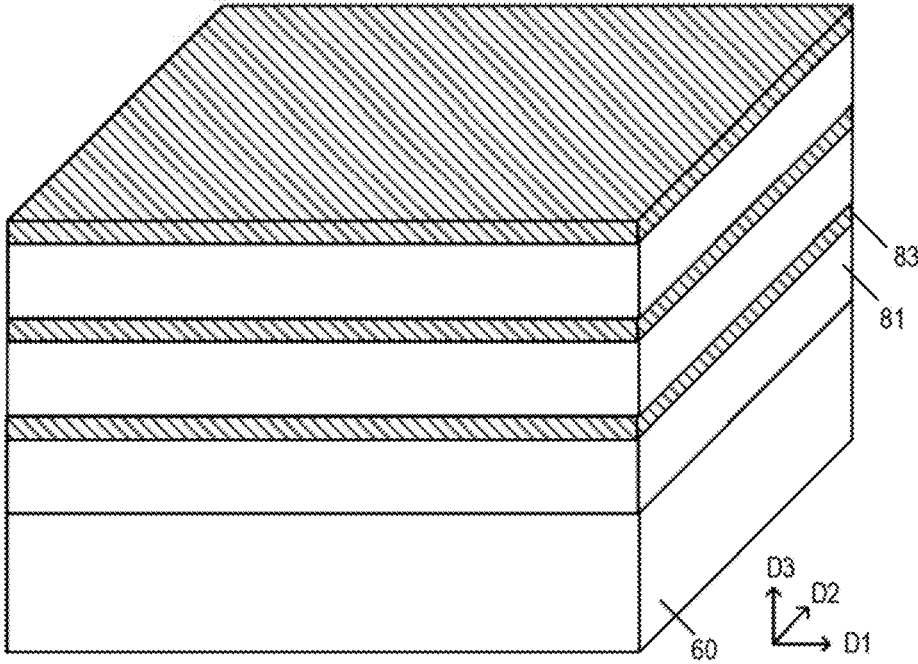

FIG. 6A

SEMICONDUCTOR STRUCTURE AND METHOD FOR FORMING SEMICONDUCTOR STRUCTURE

CROSS-REFERENCE TO RELATED APPLICATION

This application claims priority to Chinese Patent Application No. 202210568100.9, filed on May 24, 2022, the disclosure of which is hereby incorporated by reference in its entirety.

BACKGROUND

A Dynamic Random Access Memory (DRAM) is a semiconductor device commonly used in electronic devices such as computers, and is composed of multiple memory cells. Each memory cell typically includes a transistor and a capacitor. A gate electrode of the transistor is electrically connected to a word line, a source electrode is electrically connected to a bit line, and a drain electrode is electrically connected to the capacitor. A word line voltage on the word line can control the turn-on and turn-off of the transistor, so that data information can be read from or written into the capacitor through the bit line.

SUMMARY

The disclosure relates to the technical field of semiconductor manufacturing, and more particularly, to a semiconductor structure and a method for forming the semiconductor structure.

According to some embodiments, the disclosure provides a semiconductor structure, including: a substrate, a switching transistor and a storage transistor.

The switching transistor is located on a top surface of the substrate, and includes a first gate electrode, a first channel layer coating a portion of the first gate electrode, and a first source-drain electrode and a second source-drain electrode both covering a surface of the first channel layer. The first source-drain electrode and the second source-drain electrode are distributed at two opposite ends of the first channel layer in a first direction. The first direction is a direction parallel to the top surface of the substrate.

The storage transistor is located on the top surface of the substrate, and includes a second gate electrode, a second channel layer coating a portion of the second gate electrode, and a third source-drain electrode and a fourth source-drain electrode both covering a surface of the second channel layer. The third source-drain electrode and the fourth source-drain electrode are distributed at two opposite ends of the second channel layer in the first direction. A portion of the second gate electrode extending out of the second channel layer in the first direction is electrically connected to the second source-drain electrode. The storage transistor is configured to store charge.

In some embodiments, a material of the second channel layer is indium gallium zinc oxide.

In some embodiments, the switching transistor further includes a first gate electrode dielectric layer located between the first channel layer and the first gate electrode.

The storage transistor further includes a second gate electrode dielectric layer located between the second channel layer and the second gate electrode.

In some embodiments, the semiconductor structure further includes a write word line, a write bit line, a read word line, and a read bit line.

The write word line is located on the top surface of the substrate and electrically connected to a portion of the first gate electrode extending out of the first channel layer in the first direction.

The write bit line is located on the top surface of the substrate and electrically connected to the first source-drain electrode.

The read word line is located on the top surface of the substrate and electrically connected to the fourth source-drain electrode.

The read bit line is located on the top surface of the substrate and electrically connected to the third source-drain electrode.

In some embodiments, the write word line and the read word line both extend in a second direction, the write bit line and the read bit line both extend in a third direction, the second direction and the third direction both intersect the first direction, and the second direction intersects the third direction.

In some embodiments, the semiconductor structure includes multiple memory cells stacked in the third direction. Each of the multiple memory cells includes the switching transistor and the storage transistor arranged in the first direction. The second direction is a direction parallel to the top surface of the substrate. The third direction is a direction perpendicular to the top surface of the substrate.

Multiple write word lines are spaced apart in the third direction, and in two write word lines adjacent in the third direction, a write word line close to the substrate extends beyond the other write word line away from the substrate in the second direction.

Multiple read word lines are spaced apart in the third direction, and in two read word lines adjacent in the third direction, a read word line close to the substrate extends beyond the other read word line away from the substrate in the second direction.

In some embodiments, the semiconductor structure includes multiple memory cells stacked in the second direction. Each of the multiple memory cells includes the switching transistor and the storage transistor arranged in the first direction. The second direction is a direction perpendicular to the top surface of the substrate. The third direction is a direction parallel to the top surface of the substrate.

Multiple write bit lines are spaced apart in the second direction, and in two write bit lines adjacent in the second direction, a write bit line close to the substrate extends beyond the other write bit line away from the substrate in the third direction.

Multiple read bit lines are spaced apart in the second direction, and in two read bit lines adjacent in the second direction, a read bit line close to the substrate extends beyond the other read bit line away from the substrate in the third direction.

In some embodiments, a material of the write word line is a polysilicon material having first doped ions, and a material of the read word line includes a metal material.

According to other embodiments, the disclosure further provides a method for forming a semiconductor structure, including the following operations.

A substrate is provided.

A switching transistor and a storage transistor are formed on a top surface of the substrate. The switching transistor includes a first gate electrode, a first channel layer coating a portion of the first gate electrode, and a first source-drain electrode and a second source-drain electrode both covering a surface of the first channel layer. The first source-drain electrode and the second source-drain electrode are distributed at two opposite ends of the first channel layer in a first direction. The storage transistor includes a second gate electrode, a second channel layer coating a portion of the second gate electrode, and a third source-drain electrode and a fourth source-drain electrode both covering a surface of the second channel layer. The third source-drain electrode and the fourth source-drain electrode are distributed at two opposite ends of the second channel layer in the first direction. A portion of the second gate electrode extending out of the second channel layer in the first direction is electrically connected to the second source-drain electrode. The storage transistor is configured to store charge. The first direction is a direction parallel to the top surface of the substrate.

In some embodiments, the operation that the switching transistor and the storage transistor are formed on the top surface of the substrate includes the following operations.

A layer stack is formed on the top surface of the substrate. The layer stack includes multiple semiconductor layers spaced apart in a direction perpendicular to the top surface of the substrate.

A support frame covering a portion of each of the multiple semiconductor layers is formed. The support frame separates the layer stack into a switching area and a storage area arranged in the first direction. A portion of the semiconductor layer in the switching area serves as the first gate electrode, and a portion of the semiconductor layer in the storage area serves as the second gate electrode.

A channel material is deposited on the first gate electrode and the second gate electrode to form the first channel layer coating the first gate electrode and the second channel layer coating the second gate electrode.

The second source-drain electrode covering the surface of the first channel layer is formed, and the second source-drain electrode is connected to the second gate electrode.

In some embodiments, the operation that the layer stack is formed on the top surface of the substrate includes the following operations.

A first sacrificial layer and the semiconductor layer are alternately deposited on the top surface of the substrate to form the layer stack.

The layer stack is etched to form a first part, and a second part and a third part both protruding from a side wall of the first part in a second direction. The second direction is a direction parallel to the top surface of the substrate, and the second direction intersects the first direction.

Multiple first trenches penetrating through the first part are formed. The multiple first trenches separate each of the multiple semiconductor layers into multiple active strips spaced apart in the second direction.

In some embodiments, the operation that the support frame covering a portion of each of the multiple semiconductor layers is formed includes the following operations.

A switching area and a storage area are defined in the layer stack, such that the third part is located at a side of the switching area away from the storage area and the second part is located at a side of the storage area close to the switching area.

A second sacrificial layer filling the multiple first trenches and a gap between the second part and the third part is formed.

The second sacrificial layer at an end portion of the storage area adjacent to the switching area is removed, to expose a portion of each of the multiple active strips.

The support frame covering a surface of the exposed portion of the active strip is formed.

In some embodiments, the operation that the first channel layer coating the first gate electrode and the second channel layer coating the second gate electrode is formed includes the following operations.

The layer stack and the second sacrificial layer which are located at an end portion of the switching area adjacent to the support frame are removed to form a second trench exposing the substrate.

A third sacrificial layer filling the second trench is formed.

The first sacrificial layer and the second sacrificial layer are removed, to expose the portion of the first gate electrode and the portion of the second gate electrode.

A first gate electrode dielectric layer covering the exposed portion of the first gate electrode and a second gate electrode dielectric layer covering the exposed portion of the second gate electrode are formed.

The third sacrificial layer is removed, to expose an end portion of the second gate electrode located in the support frame.

Second doped ions are implanted into the exposed end portion of the second gate electrode.

A channel material is deposited on the first gate electrode and the second gate electrode to form the first channel layer coating the first gate electrode and the second channel layer coating the second gate electrode, and the first channel layer is in contact with the end portion of the second gate electrode implanted with the second doped ions.

In some embodiments, before the second source-drain electrode covering the surface of the first channel layer is formed, the method further includes the following operations.

A conductive material is deposited on a portion of the surface of the second channel layer and a surface of the second part in the storage area, to form the fourth source-drain electrode and a read word line extending in the second direction and successively connecting multiple fourth source-drain electrodes.

In some embodiments, after the second source-drain electrode covering the surface of the first channel layer is formed, the method further includes the following operations.

The first source-drain electrode, the third source-drain electrode, a read bit line, and a write bit line are formed. The first source-drain electrode and the second source-drain electrode are distributed at two opposite ends of the first channel layer in the first direction. The third source-drain electrode and the fourth source-drain electrode are distributed at two opposite ends of the second channel layer in the first direction. The read bit line extends in a third direction and continuously connects multiple third source-drain electrodes spaced apart in the third direction. The write bit line extends in the third direction and continuously connects multiple first source-drain electrodes spaced apart in the third direction. The third direction is a direction perpendicular to the top surface of the substrate.

A write word line is formed in the third part and a portion of the first part connected to the third part in the second direction, and the write word line is connected to the first gate electrode.

BRIEF DESCRIPTION OF THE DRAWINGS

FIG. 5 is a flowchart of a method for forming a semiconductor structure according to some embodiments of the disclosure.

DETAILED DESCRIPTION

The specific implementations of a semiconductor structure and a method for forming the semiconductor structure provided in the disclosure will be described in detail below with reference to the drawings.

In order to increase the density of transistors and capacitors in a semiconductor structure such as DRAM, a lateral arrangement of capacitors is often used. However, as a semiconductor technology continues to advance, a size of the semiconductor structure continues to shrink, and an increase in storage density of the semiconductor structure having a horizontal capacitor structure is limited, thereby restricting further development of the semiconductor structure.

Therefore, how to improve the storage density of the semiconductor structure and extend an application field of the semiconductor structure is a technical problem to be solved urgently at present.

Figure 1:
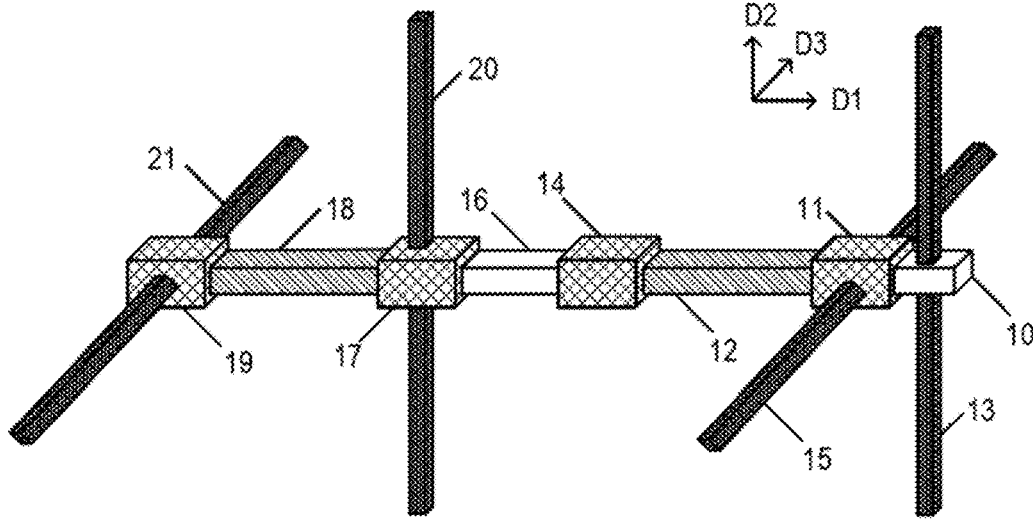
FIG. 1 is a schematic diagram of a semiconductor structure according to some embodiments of the disclosure.
Figure 2:
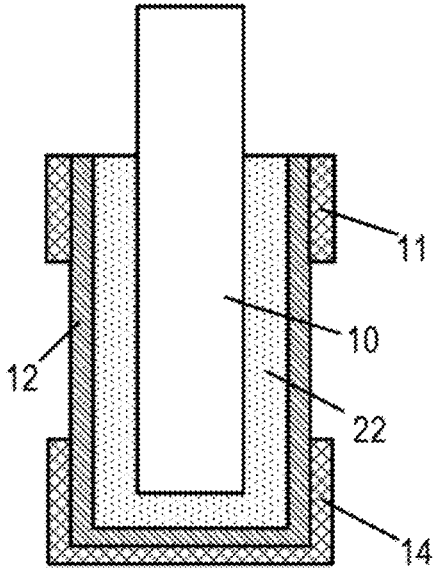
FIG. 2 is a schematic structural diagram of a transistor according to some embodiments of the disclosure.
Figures 3, 4:
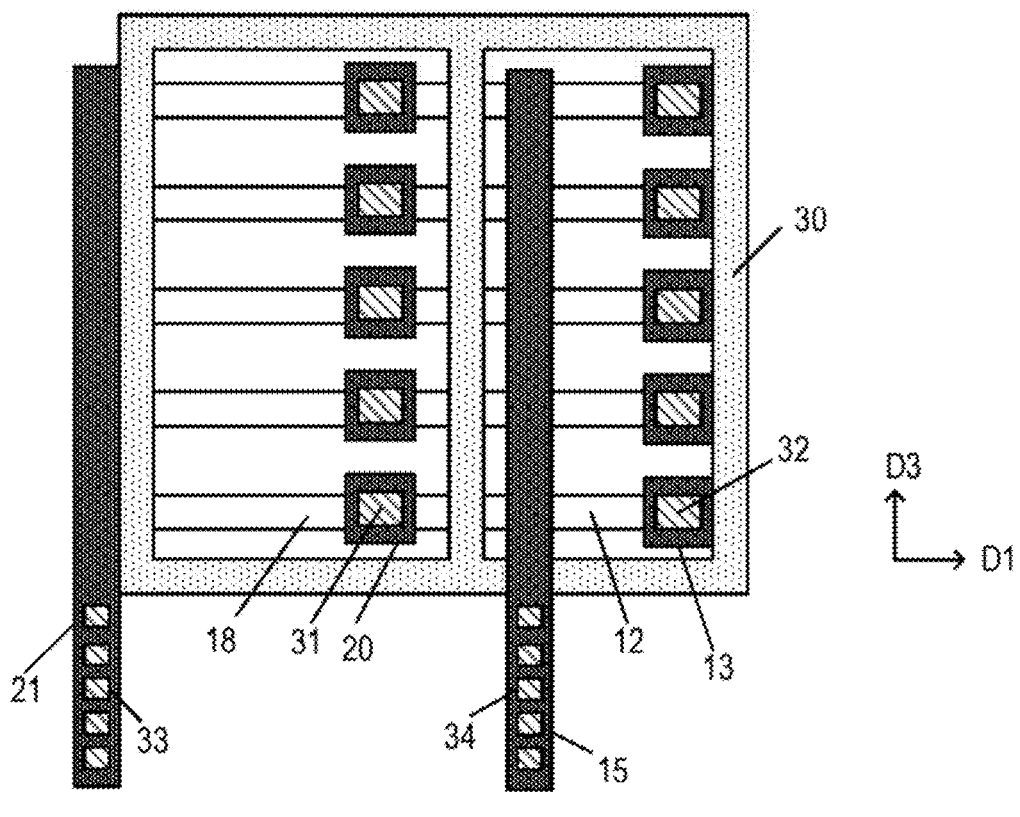
FIG. 3 is a schematic top-view diagram of a semiconductor structure according to some embodiments of the disclosure.
FIG. 4 is a schematic circuit diagram of a semiconductor structure according to some embodiments of the disclosure.

Embodiments of the disclosure provide a semiconductor structure and a method for forming the semiconductor structure, which are intended to solve the problem of low storage density of the semiconductor structure and extend the application field of the semiconductor structure. FIG. 1 is a schematic diagram of a semiconductor structure according to some embodiments of the disclosure. FIG. 2 is a schematic structural diagram of a transistor (e.g. a switching transistor) according to some embodiments of the disclosure. FIG. 3 is a schematic top-view diagram of a semiconductor structure according to some embodiments of the disclosure. FIG. 4 is a schematic circuit diagram of a semiconductor structure according to some embodiments of the disclosure. The semiconductor structure provided by the embodiments of the disclosure may be used to form a DRAM. However, the disclosure is not limited thereto. As shown in FIGS. 1-4, the semiconductor structure includes: a substrate, a switching transistor T1 and a storage transistor T2.

The switching transistor T1 is located on a top surface of the substrate (not shown in FIGS. 1-4), and includes a first gate electrode 10, a first channel layer 12 coating a portion of the first gate electrode 10, and a first source-drain electrode 11 and a second source-drain electrode 14 both covering a surface of the first channel layer 12. The first source-drain electrode 11 and the second source-drain electrode 14 are distributed at two opposite ends of the first channel layer 12 in a first direction D1. The first direction D1 is a direction parallel to the top surface of the substrate.

The storage transistor T2 is located on the top surface of the substrate, and includes a second gate electrode 16, a second channel layer 18 coating a portion of the second gate electrode 16, and a third source-drain electrode 19 and a fourth source-drain electrode 17 both covering a surface of the second channel layer 18. The third source-drain electrode 19 and the fourth source-drain electrode 17 are distributed at two opposite ends of the second channel layer 18 in the first direction D1. A portion of the second gate electrode 16 extending out of the second channel layer 18 in the first direction D1 is electrically connected to the second source-drain electrode 14. The storage transistor is configured to store charge.

For example, the substrate may be, but is not limited to, a silicon substrate. The embodiments of the disclosure will be described with reference to the silicon substrate as an example. In other examples, the substrate may be a semiconductor substrate such as gallium nitride, gallium arsenide, gallium carbide, silicon carbide, or SOI. The top surface of the substrate refers to a surface of the substrate on which the switching transistor T1 and the storage transistor T2 are formed. The semiconductor structure includes multiple memory cells arranged in an array, and the multiple memory cells are located in an area surrounded by a support frame 30. Each memory cell includes a storage area and a switching area separated by the support frame 30, the storage area has the storage transistor T2 therein, and the switching area has the switching transistor T1 therein, so as to form a 2T0C (two transistor-zero capacitor) structure, thereby eliminating the need for a capacitor structure in the memory cell to reduce a volume of the memory cell and increase the storage density of a memory. The storage transistor T2 is configured to store charge and read a storage signal. The switching transistor T1 is connected to the storage transistor T2 for controlling charging and discharging of the storage transistor T2, so as to write a storage signal into the storage transistor T2. The portion of the second gate electrode 16 extending out of the second channel layer 18 in the first direction D1 is electrically connected to the second source-drain electrode 14, meaning that a portion of the second gate electrode 16 not covered by the second channel layer 18 is electrically connected to the second source-drain electrode 14.

As shown in FIG. 2, the switching transistor T1 is of a channel all around structure, i.e. the first channel layer 12 of the switching transistor T1 coats a portion of the first gate electrode 10, so that a size of the memory cell can be further reduced, thereby increasing the storage density of the semiconductor structure. The first source-drain electrode 11 and the second source-drain electrode 14 in the switching transistor T1 independently cover the surface of the first channel layer 12, and the first source-drain electrode 11 and the second source-drain electrode 14 are distributed at two opposite ends of the first channel layer 12 in the first direction D1. A portion of the first gate electrode 10 extends out of the first channel layer 12 in the first direction D1. Similarly, the storage transistor T2 is also of a channel all around structure, i.e. the second channel layer 18 of the storage transistor T2 coats a portion of the second gate electrode 16, so that the size of the memory cell can be further reduced, thereby increasing the storage density of the semiconductor structure. The third source-drain electrode 19 and the fourth source-drain electrode 17 in the storage transistor T2 independently cover two opposite sides of the second channel layer 18 in the first direction D1. A portion of the second gate electrode 16 extends out of the second channel layer 18 in the first direction D1. The second source-drain electrode 14 of the switching transistor is electrically connected to the portion of the second gate electrode 16 extending out of the second channel layer 18 in the first direction D1, so as to control the turn-on and off of the storage transistor T2 through the switching transistor T1.

In some embodiments, a material of at least one of the first channel layer 12 and the second channel layer 18 is indium gallium zinc oxide (IGZO).

For example, the material of indium gallium zinc oxide has excellent properties such as high switching ratio and low leakage current, and a retention time thereof is sufficient for the storage transistor T2 to store charge. Therefore, in the embodiments of the disclosure, the material of indium gallium zinc oxide is utilized to form the second channel layer 18, so as to further improve a charge retention property of the semiconductor structure. In an embodiment, the material of the first channel layer 12 is the same as that of the second channel layer 18, such as indium gallium zinc oxide, so that the first channel layer 12 and the second channel layer 18 may be formed simultaneously, thereby further simplifying a fabrication process of the semiconductor structure.

In some embodiments, the switching transistor T1 further includes a first gate electrode dielectric layer 22. The first gate electrode dielectric layer 22 is located between the first channel layer 12 and the first gate electrode 10.

The storage transistor T2 further includes a second gate electrode dielectric layer located between the second channel layer 18 and the second gate electrode 16.

In an embodiment, a material of the first gate electrode dielectric layer 22 may be the same as that of the second gate electrode dielectric layer, such as an oxide (e.g. silicon dioxide) material, and the disclosure is not limited thereto. For example, the first gate electrode dielectric layer 22 and the second gate electrode dielectric layer may be formed using a process such as an in-situ oxidative growth (e.g. in-situ water vapor generation) or atomic layer deposition.

In some embodiments, the semiconductor structure further includes: a write word line 13, a write bit line 15, a read word line 20, and a read bit line 21.

The write word line 13 is located on the top surface of the substrate and electrically connected to a portion of the first gate electrode 10 extending out of the first channel layer 12 in the first direction.

The write bit line 15 is located on the top surface of the substrate and electrically connected to the first source-drain electrode 11.

The read word line 20 is located on the top surface of the substrate and electrically connected to the fourth source-drain electrode 17.

The read bit line 21 is located on the top surface of the substrate and electrically connected to the third source-drain electrode 19.

In some embodiments, the write word line 13 and the read word line 20 both extend in a second direction D2, the write bit line 15 and the read bit line 21 both extend in a third direction D3, the second direction D2 and the third direction D3 both intersect the first direction D1, and the second direction D2 intersects the third direction D3. The write word line 13 is electrically connected to the portion of the first gate electrode 10 extending out of the first channel layer 12 in the first direction, meaning that the write word line 13 is electrically connected to a portion of the first gate electrode 10 not covered by the first channel layer 12.

In order to further improve the storage density and integration level of the semiconductor structure, in some embodiments, the semiconductor structure includes multiple memory cells stacked in the second direction D2. Each of the memory cells includes the switching transistor T1 and the storage transistor T2 arranged in the first direction D1. The second direction D2 is a direction perpendicular to the top surface of the substrate. The third direction D3 is a direction parallel to the top surface of the substrate.

The multiple write bit lines 15 are spaced apart in the second direction D2, and in two write bit lines 15 adjacent in the second direction D2, the write bit line 15 close to the substrate extends beyond the other write bit line 15 away from the substrate in the third direction D3.

The multiple read bit lines 21 are spaced apart in the second direction D2, and in two read bit lines 21 adjacent in the second direction D2, the read bit line 21 close to the substrate extends beyond the other read bit line 21 away from the substrate in the third direction D3.

For example, the semiconductor structure includes multiple layers of memory cells stacked in the second direction D2. Each layer of memory cells includes at least multiple memory cells spaced apart in the third direction D3, thereby forming a memory cell array having a three-dimensional structure. The write word line 13 extends in the second direction D2 and is continuously and electrically connected to the first gate electrodes 10 in the multiple memory cells spaced apart in the second direction D2 to form a vertical write word line structure. The write bit line 15 extends in the third direction D3 and is continuously and electrically connected to the first source-drain electrodes 11 in the multiple memory cells spaced apart in the third direction D3 to form a horizontal write bit line structure. The read word line 20 extends in the second direction D2 and is continuously and electrically connected to the fourth source-drain electrodes 17 in the multiple memory cells spaced apart in the second direction D2 to form a vertical read word line structure. The read bit line 21 extends in the third direction D3 and is continuously and electrically connected to the third source-drain electrodes 19 in the multiple memory cells spaced apart in the third direction D3 to form a horizontal read bit line structure.

The multiple write bit lines 15 are spaced apart in the second direction D2, and end portions of the multiple write bit lines 15 form a staircase structure (i.e. in the two write bit lines 15 adjacent in the second direction D2, the write bit line 15 close to the substrate extends beyond the other write bit line 15 away from the substrate in the third direction D3), so as to facilitate a lead-in of a write bit line signal from the same side of the semiconductor structure through a write bit line plug 34, thereby further improving the integration level of the semiconductor structure. The multiple read bit lines 21 are spaced apart in the second direction D2, and end portions of the multiple read bit lines 21 also form a staircase structure (i.e. in the two read bit lines 21 adjacent in the second direction D2, the read bit line 21 close to the substrate extends beyond the other read bit line 21 away from the substrate in the third direction D3), so as to facilitate a lead-out of a read bit line signal from the same side of the semiconductor structure through a read bit line plug 33, thereby further improving the integration level of the semiconductor structure. The write word line 13 leads in a write word line signal through a write word line plug 32 located above it, and the read word line 20 leads in a read word line signal through a read word line plug 31 located above it.

In other embodiments, the semiconductor structure includes multiple memory cells stacked in the third direction D3. Each of the memory cells includes the switching transistor T1 and the storage transistor T2 arranged in the first direction D1. The second direction D2 is a direction parallel to the top surface of the substrate. The third direction D3 is a direction perpendicular to the top surface of the substrate.

The multiple write word lines 13 are spaced apart in the third direction D3, and in two write word lines 13 adjacent in the third direction D3, the write word line 13 close to the substrate extends beyond the other write word line 13 away from the substrate in the second direction D2.

The multiple read word lines 20 are spaced apart in the third direction D3, and in two read word lines 20 adjacent in the third direction D3, the read word line 20 close to the substrate extends beyond the other read word line 20 away from the substrate in the second direction D2.

In this case, a horizontal write word line structure, a horizontal read word line structure, a vertical write bit line structure, and a vertical read bit line structure may be formed.

To simplify the fabrication process of the semiconductor structure, in some embodiments, the material of the write word line 13 is a polysilicon material having first doped ions, and the material of the read word line 20 is a metal material.

In other embodiments, to reduce a resistance of the write word line 13, both the materials of the write word line 13 and the read word line 20 are metal materials (e.g. metal tungsten).

It is to be noted that in the embodiments of the disclosure, the first source-drain electrode may be one of a source electrode and a drain electrode, and the second source-drain electrode may be the other of the source electrode and the drain electrode. Similarly, the third source-drain electrode may be one of a source electrode and a drain electrode, and the fourth source-drain electrode may be the other of the source electrode and the drain electrode.

Figure 6B:
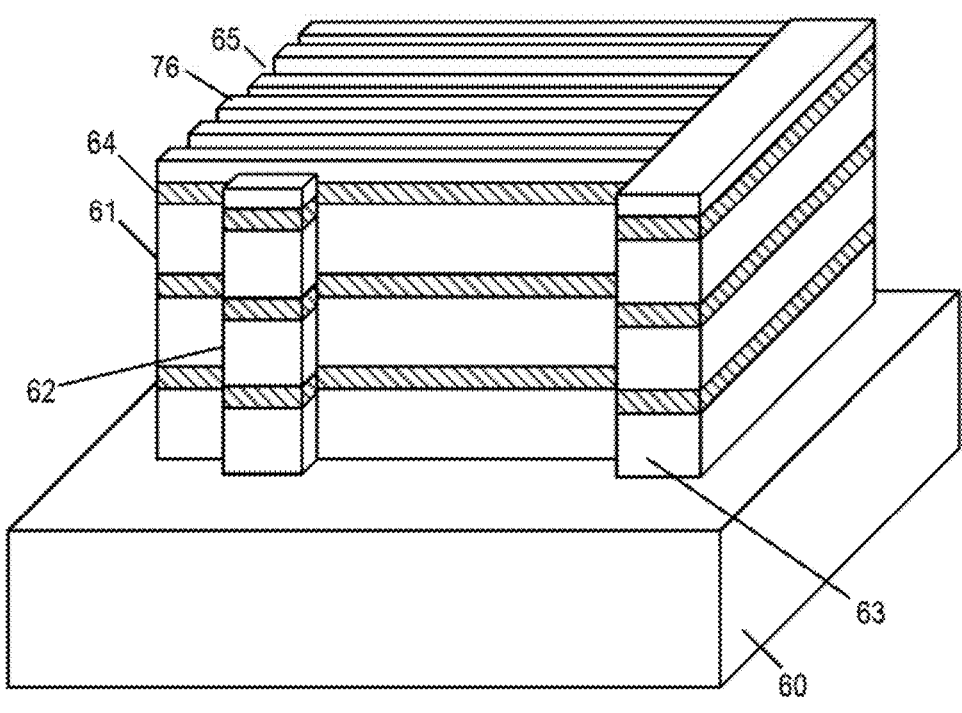
FIGS. 6A-6Q are schematic diagrams of a principal process structure in the process of forming a semiconductor structure according to some embodiments of the disclosure.
Figure 6C:
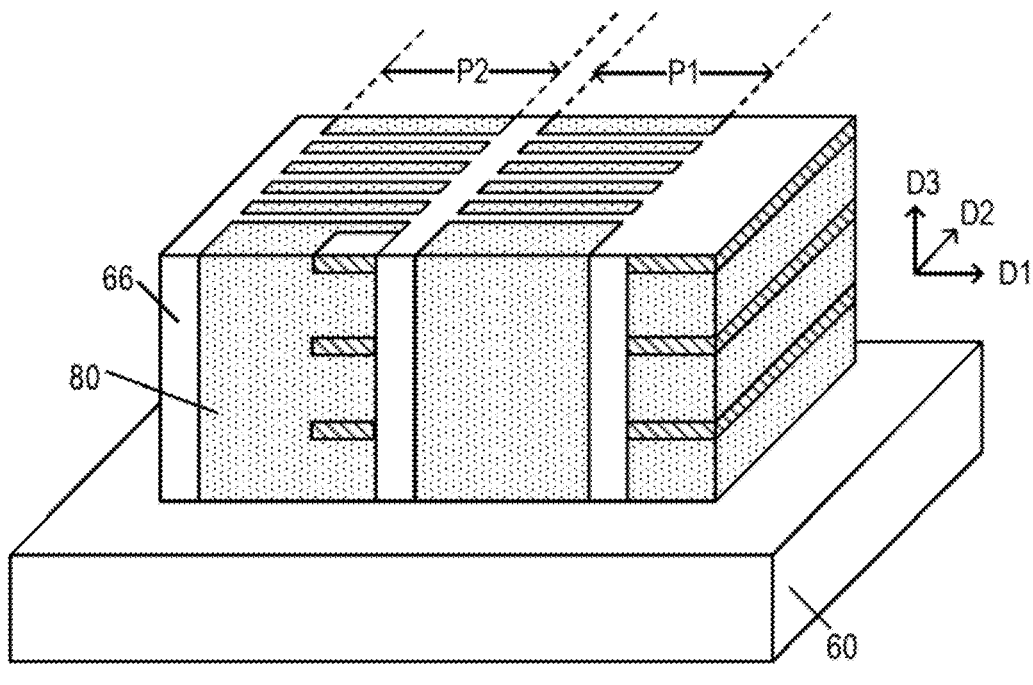
Figure 6D:
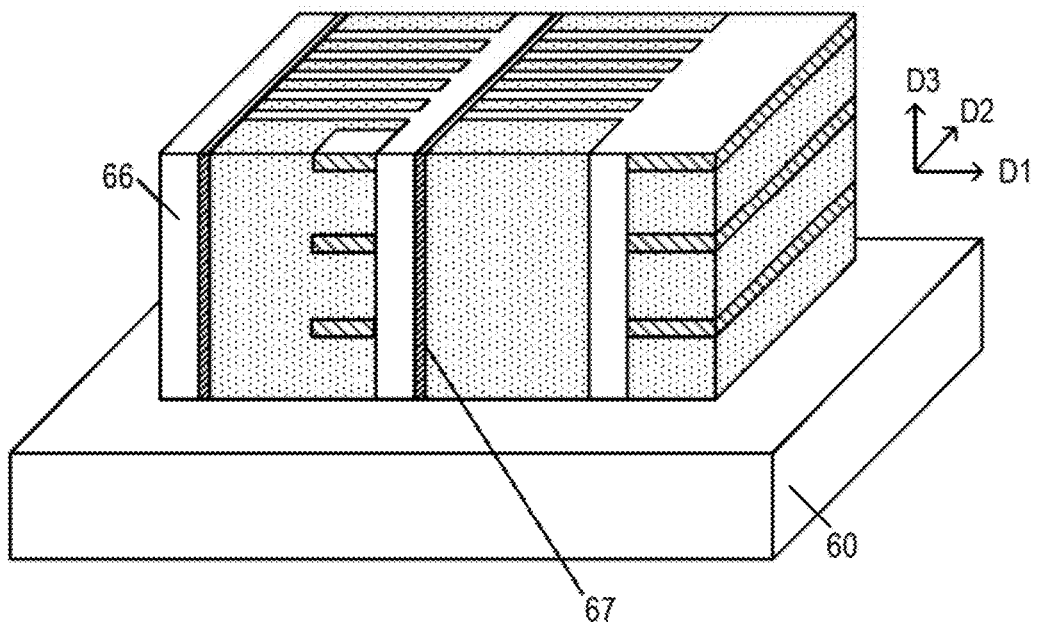
Figure 6E:
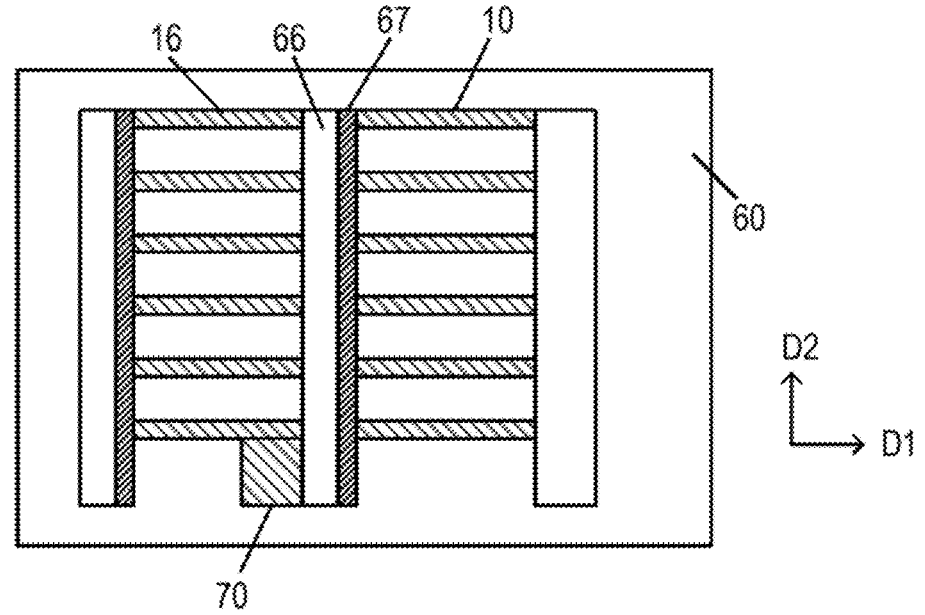
Figure 6F:
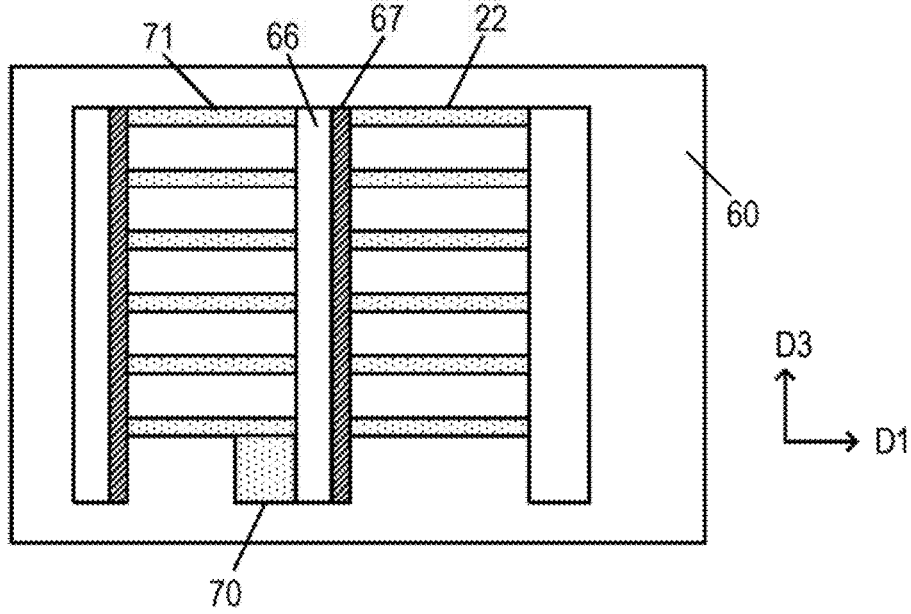
Figure 6G:
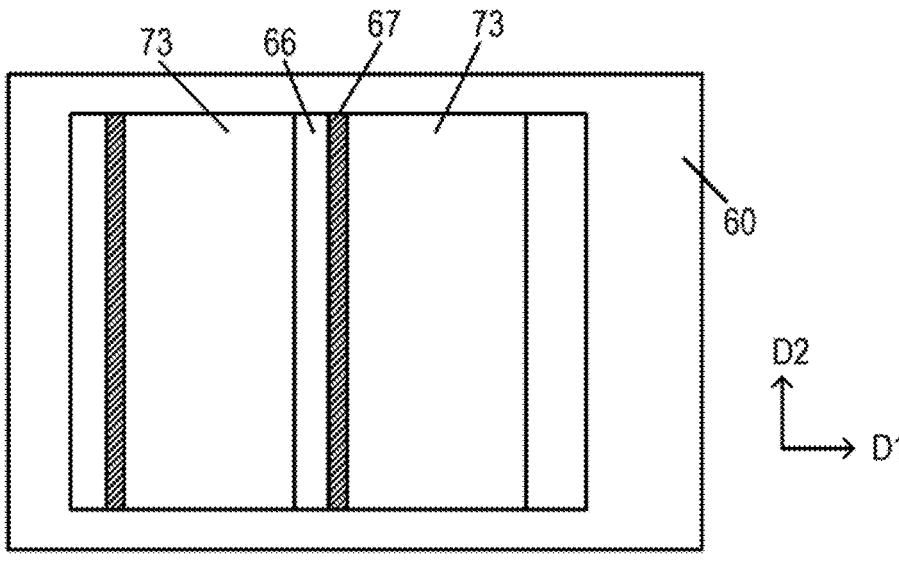
Figure 6H:
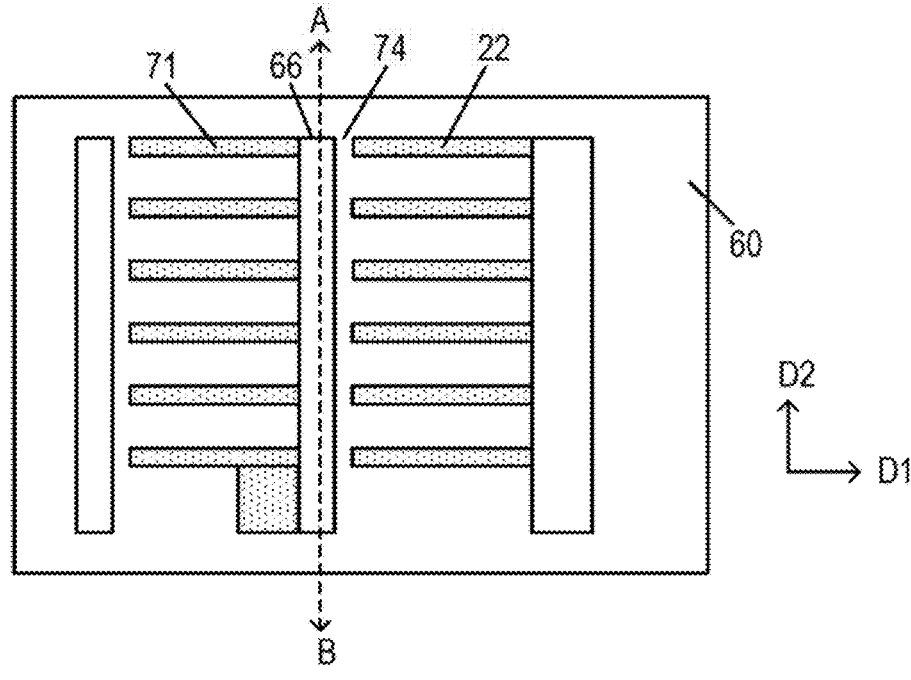
Figure 6I:
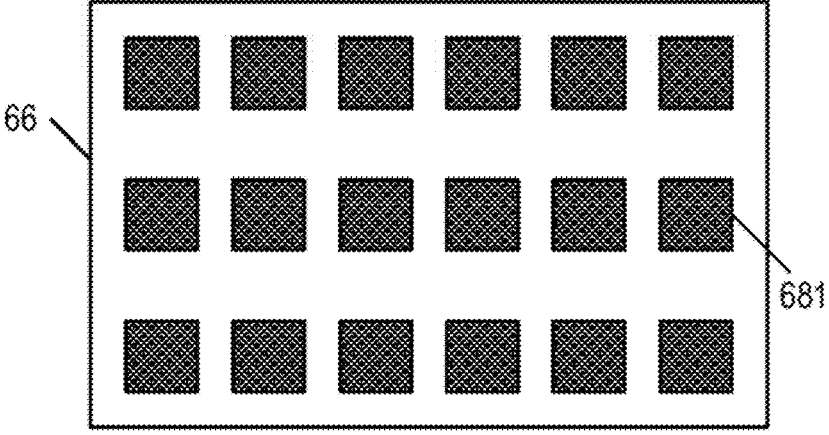

The embodiments of the disclosure further provide a method for forming a semiconductor structure. FIG. 5 is a flowchart of a method for forming a semiconductor structure according to some embodiments of the disclosure. FIGS. 6A-6Q are schematic diagrams of a principal process structure in the process of forming a semiconductor structure according to some embodiments of the disclosure. The method for forming the semiconductor structure provided by the embodiments of the disclosure may be used to form the semiconductor structure as shown in FIGS. 1-4. As shown in FIG. 5 and FIGS. 6A-6Q, the method for forming the semiconductor structure includes the following operations.

In S51, a substrate 60 is provided, as shown in FIG. 6A.

For example, the substrate 60 may be, but is not limited to, a silicon substrate. The embodiments of the disclosure will be described with reference to the silicon substrate as an example. In other examples, the substrate 60 may be a semiconductor substrate such as gallium nitride, gallium arsenide, gallium carbide, silicon carbide, or SOI.

In S52, a switching transistor and a storage transistor are formed on a top surface of the substrate 60. The switching transistor includes a first gate electrode 10, a first channel layer 12 coating a portion of the first gate electrode 10, and a first source-drain electrode 11 and a second source-drain electrode 14 both covering a surface of the first channel layer 12. The first source-drain electrode 11 and the second source-drain electrode 14 are distributed at two opposite ends of the first channel layer 12 in a first direction D1. The storage transistor includes a second gate electrode 16, a second channel layer 18 coating a portion of the second gate electrode 16, and a third source-drain electrode 19 and a fourth source-drain electrode 17 both covering a surface of the second channel layer 18. The third source-drain electrode 19 and the fourth source-drain electrode 17 are distributed at two opposite ends of the second channel layer 18 in the first direction D1. A portion of the second gate electrode 16 extending out of the second channel layer 18 in the first direction D1 is electrically connected to the second source-drain electrode 14. The storage transistor is configured to store charge. The first direction D1 is a direction parallel to the top surface of the substrate 60.

In some embodiments, the operation that the switching transistor and the storage transistor are formed on the top surface of the substrate 60 includes the following operations.

A layer stack is formed on the top surface of the substrate. The layer stack includes multiple semiconductor layers 83 spaced apart in a direction perpendicular to the top surface of the substrate, as shown in FIG. 6A.

A support frame 66 covering a portion of the semiconductor layer 83 is formed. The support frame 66 separates the layer stack into a switching area P1 and a storage area P2 arranged in the first direction D1. The semiconductor layer 83 in the switching area P1 serves as the first gate electrode 10, and the semiconductor layer 83 in the storage area P2 serves as the second gate electrode 16, as shown in FIG. 6C.

Figure 6J:
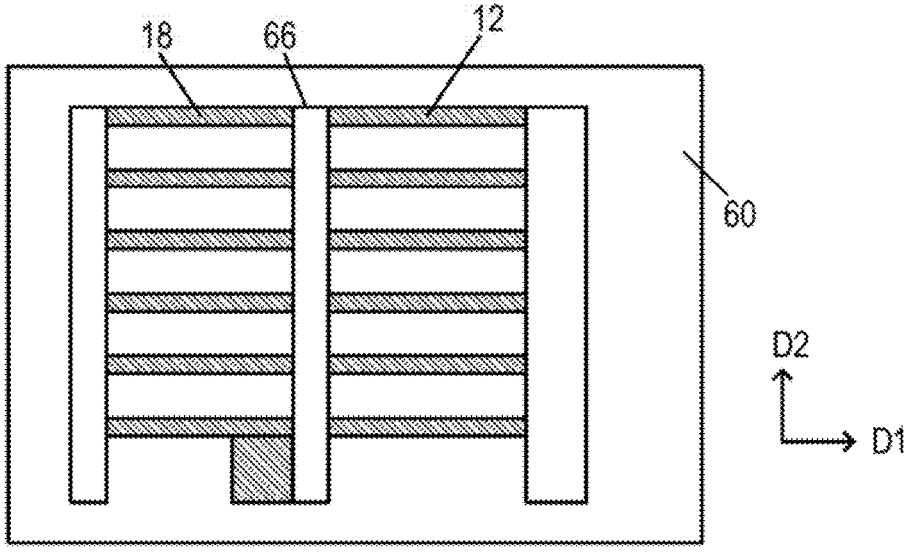
Figure 6K:
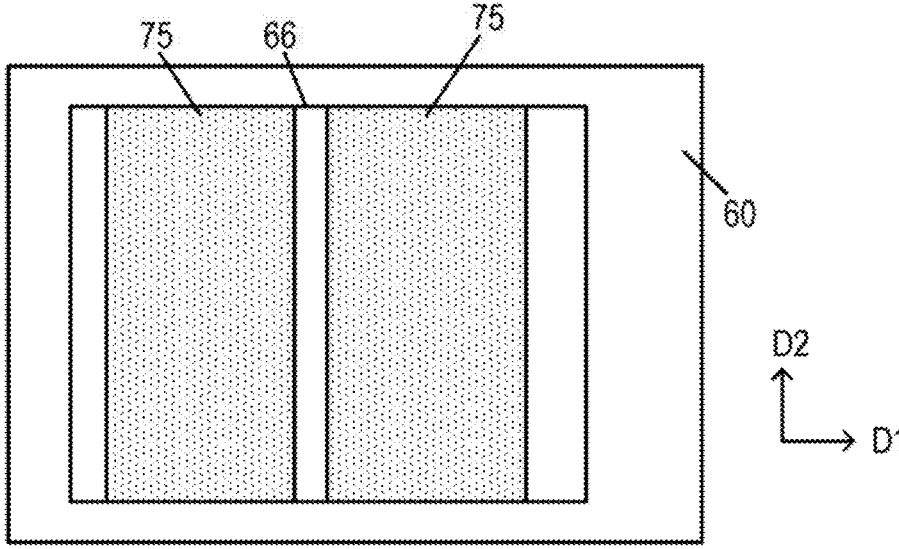
Figures 6L, 6M:
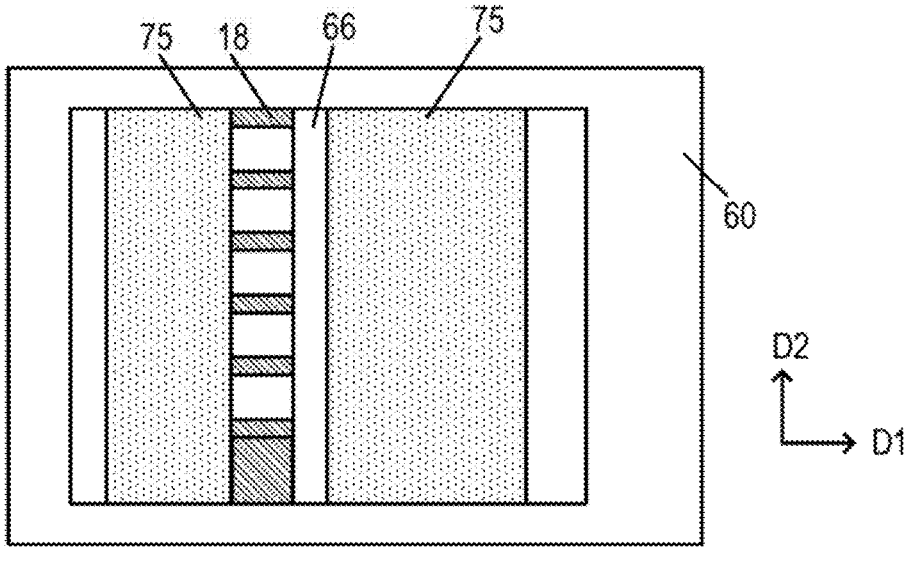

A channel material is deposited on the first gate electrode 10 and the second gate electrode 16 to form the first channel layer 12 coating the first gate electrode 10 and the second channel layer 18 coating the second gate electrode 16, as shown in FIG. 6J.

Figure 6N:
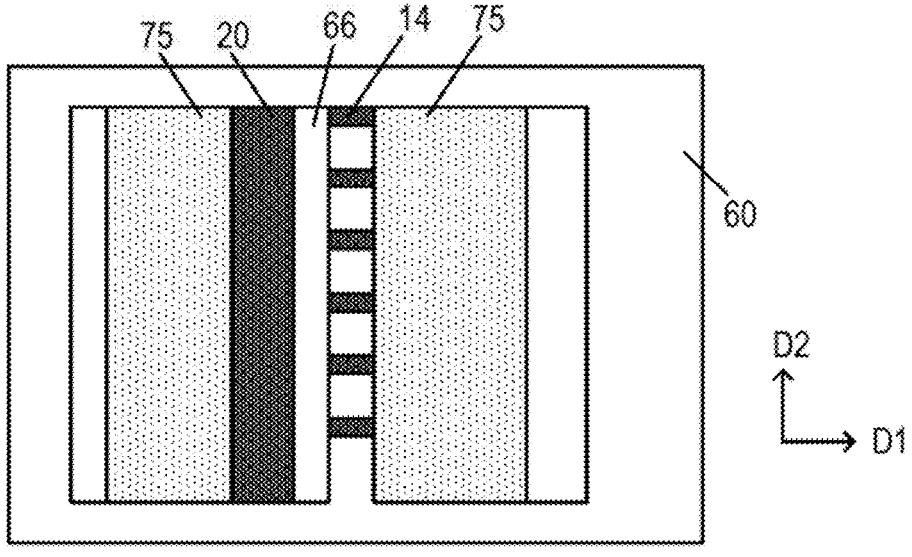

The second source-drain electrode 14 covering the surface of the first channel layer 12 is formed, and the second source-drain electrode 14 is connected to the second gate electrode 16, as shown in FIG. 6N.

In some embodiments, the operation that the layer stack is formed on the top surface of the substrate 60 includes the following operations.

A first sacrificial layer 81 and the semiconductor layer 83 are alternately deposited on the top surface of the substrate 60 to form the layer stack, as shown in FIG. 6A.

The layer stack is etched to form a first part 61, and a second part 62 and a third part 63 both protruding from a side wall of the first part 61 in a second direction D2. The second direction D2 is a direction parallel to the top surface of the substrate 60, and the second direction D2 intersects the first direction D1, as shown in FIG. 6B.

Multiple first trenches 65 penetrating through the first part 61 are formed. The multiple first trenches 65 separate each of the semiconductor layers 83 into multiple active strips 64 spaced apart in the second direction D2, as shown in FIG. 6B.

For example, the first sacrificial layer 81 and the semiconductor layer 83 may be alternately deposited on the top surface of the substrate 60 in the third direction using a deposition process, such as a chemical vapor deposition, a physical vapor deposition, or an atomic layer deposition, to form the layer stack, so as to obtain the structure shown in FIG. 6A. The material of the first sacrificial layer 81 may be an oxide material (such as silicon dioxide) or a silicon germanium material, and the material of the semiconductor layer 83 may be a polysilicon material having first doped ions. It is to be noted that the surface of the polysilicon material is generally rough, and the surface may be planarized using a chemical mechanical polishing process or the like. The first doped ions may be P-type ions or N-type ions. Thereafter, a hard mask material such as silicon nitride may be deposited on the top surface of the layer stack to form a hard mask layer 76. Other mask layers may also be deposited on the hard mask layer 76, such that the first part 61, the second part 62, the third part 63, and the multiple first trenches 65 penetrating through the first part 61 may be formed using a Self-Aligned Double Patterning (SADP) or Self-Aligned Quadruple Patterning (SAQP) process. The first part 61 is subsequently used to form the storage transistor and the switching transistor, the second part 62 is subsequently used to form the read word line, and the third part 63 is subsequently used to form the write word line. The remaining hard mask layer 76 (e.g. the layer of silicon nitride) after formation of the first trench 65 may protect the topmost semiconductor layer in the layer stack.

In some embodiments, the operation that the support frame 66 covering the portion of the semiconductor layer 83 is formed includes the following operations.

The switching area P1 and the storage area P2 are defined in the layer stack, such that the third part 63 is located at a side of the switching area P1 away from the storage area P2 and the second part 62 is located at a side of the storage area P2 close to the switching area P1.

A second sacrificial layer 80 filling the first trench 65 and a gap between the second part 62 and the third part 63 is formed.

The second sacrificial layer 80 at an end portion of the storage area P2 adjacent to the switching area P1 is removed to expose a portion of the active strip 64.

The support frame 66 covering the surface of the exposed active strip 64 is formed, as shown in FIG. 6C.

In some embodiments, the operation that the first channel layer 12 coating the first gate electrode 10 and the second channel layer 18 coating the second gate electrode 16 are formed includes the following operations.

The layer stack and the second sacrificial layer 80 at an end portion of the switching area P1 adjacent to the support frame 66 are removed to form a second trench exposing the substrate 60.

A third sacrificial layer 67 filling the second trench is formed, as shown in FIG. 6D.

The first sacrificial layer 81 and the second sacrificial layer 80 are removed to expose a portion of the first gate electrode 10 and a portion of the second gate electrode 16, as shown in FIG. 6E.

A first gate electrode dielectric layer 22 covering the exposed first gate electrode 10 and a second gate electrode dielectric layer 71 covering the exposed second gate electrode 16 are formed, as shown in FIG. 6F.

The third sacrificial layer 67 is removed, and an end portion of the second gate electrode 16 located in the support frame 66 is exposed, as shown in FIG. 6H.

Second doped ions are implanted into the exposed end portion 681 of the second gate electrode 16, as shown in FIG. 6I.

A channel material is deposited on the first gate electrode 10 and the second gate electrode 16 to form the first channel layer 12 coating the first gate electrode 10 and the second channel layer 18 coating the second gate electrode 16, and the first channel layer 12 is in contact with the end portion of the second gate electrode 16 implanted with the second doped ions, as shown in FIG. 6J.

For example, the layer stack and the second sacrificial layer 80 may be etched along the support frame 66 using SADP or SAQP to form the second trench exposing the substrate on both the side of the switching area P1 facing the storage area P2 and the side of the storage area P2 facing away from the switching area P1. Thereafter, the third sacrificial layer 67 filling the second trench may be formed using an epitaxial growth process, as shown in FIG. 6D. The material of the support frame 66 may be the same as the material of the hard mask layer 76. In an embodiment, the material of the support frame 66 may be, but is not limited to, a nitride material (e.g. silicon nitride). The material of the second sacrificial layer may be, but is not limited to, an oxide material (e.g. silicon dioxide). The material of the third sacrificial layer 67 should have a high etch selectivity with the material of the support frame 66 to facilitate subsequent selective etching. In an embodiment, the material of the third sacrificial layer 67 may be silicon. Next, the first sacrificial layer 81 and the second sacrificial layer 80 in the layer stack may be removed using a wet etch process, so as to form a top-view schematic structural diagram as shown in FIG. 6E. The third part 63 and the top surface of the portion of the first part 61 connected to the third part 63 in the second direction D2 are covered by the support frame 66. Therefore, the first sacrificial layer 81 in the third part 63 and the portion of the first part 61 connected to the third part 63 in the second direction D2 is not removed. The first gate electrode dielectric layer 22 is then formed on the exposed surface of the first gate electrode 10, and the second gate electrode dielectric layer 71 is simultaneously formed on the exposed surface of the second gate electrode 16 using an in-situ oxidative growth (e.g. in-situ water vapor growth) or atomic layer deposition process, so as to form a top-view schematic structural diagram as shown in FIG. 6F. The materials of the first gate electrode dielectric layer 22 and the second gate electrode dielectric layer 71 may be silicon dioxide or other materials having a relatively high dielectric constant (High-K, HK).

Next, a hard mask material is spin-coated on the switching area P1 and the storage area P2 to form a first filling layer 73 filling the gap of the switching area P1 and the gap of the storage area P2, so as to form a top-view schematic structural diagram as shown in FIG. 6G. The third sacrificial layer 67 is then removed to form a third trench 74 exposing an end portion of the second gate electrode 16 located in the support frame 66, so as to form a top-view schematic structural diagram as shown in FIG. 6H. Thereafter, after removing the first filling layer 73, second doped ions are implanted into the end portion of the second gate electrode 16 exposed to the third trench 74, as shown in FIG. 6I, so as to enhance the conductivity of the end portion of the second gate electrode 16 and reduce a contact resistance between the switching transistor and the storage transistor inside the semiconductor structure.

A channel material, such as IGZO, is deposited on the first gate electrode dielectric layer 22 and the second gate electrode dielectric layer 71 using an atomic layer deposition process to form the first channel layer 12 on the surface of the first gate electrode dielectric layer 22 and coating a portion of the first gate electrode 10, and the second channel layer 18 on the surface of the second gate electrode dielectric layer 71 and coating a portion of the second gate electrode 16, so as to obtain a top-view schematic structural diagram as shown in FIG. 6J. The deposition of the channel material may cause the first channel layer 12 to be in contact with the end portion of the second gate electrode 16 implanted with the second doped ions, thereby connecting the switching area P1 and the storage area P2. An insulating dielectric material such as oxide (e.g. silicon dioxide) is backfilled to form a second filling layer 75, so as to form a top-view schematic structural diagram as shown in FIG. 6K.

In some embodiments, before the second source-drain electrode 14 covering the surface of the first channel layer 12 is formed, the method further includes the following operations.

A conductive material is deposited on a surface of the portion of the second channel layer 18 and a surface of the second part 62 in the storage area P2, to form a fourth source-drain electrode and a read word line 20 extending in the second direction D2 and successively connecting multiple fourth source-drain electrodes, as shown in FIG. 6M.

For example, the second filling layer 75 on the surface of a portion of the second channel layer 18 and the surface of the second part 62 may be removed using, for example, a photoetching process, and the portion of the second channel layer 18 is exposed. Thereafter, a conductive material, such as metal tungsten or TiN, is deposited on the surface of the exposed second channel layer 18 using an atomic layer deposition process, to form the fourth source-drain electrode of the storage transistor and the read word line 20 extending in the second direction D2 and successively connecting the multiple fourth source-drain electrodes, as shown in FIG. 6M. Thereafter, the second filling layer 75 on the surface of a portion of the first channel layer 12 is removed, and the portion of the first channel layer 12 is exposed. Next, a conductive material such as metal tungsten or TiN is deposited on the surface of the exposed first channel layer 12 to form a second source-drain electrode 14 of the switching transistor, as shown in FIG. 6N.

In some embodiments, after the second source-drain electrode 14 covering the surface of the first channel layer 12 is formed, the method further includes the following operations.

Figure 6O:
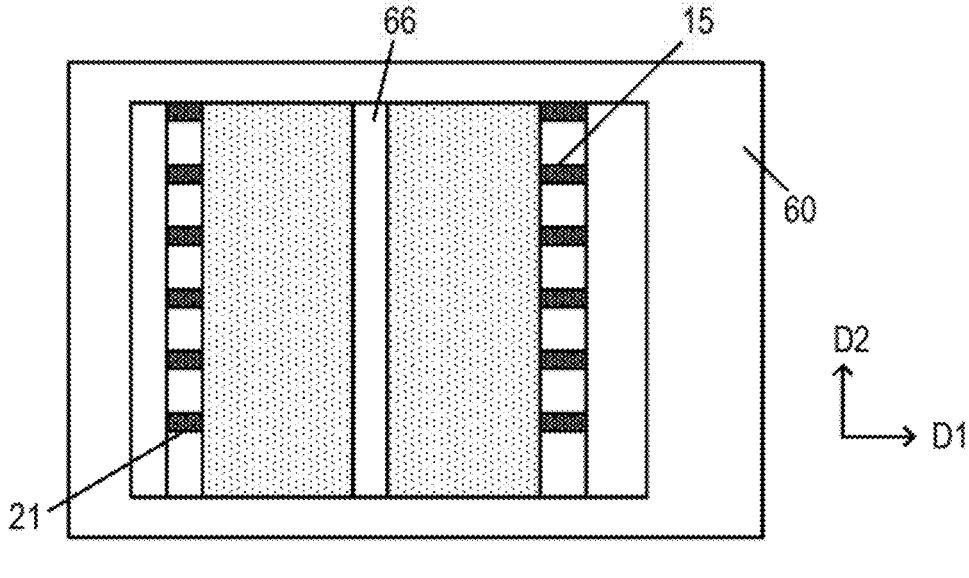

The first source-drain electrode 11, the third source-drain electrode 19, a read bit line 21, and a write bit line 15 are formed. As shown in FIG. 6O, the first source-drain electrode 11 and the second source-drain electrode 14 are distributed at two opposite ends of the first channel layer 12 in the first direction D1. The third source-drain electrode 19 and the fourth source-drain electrode 17 are distributed at two opposite ends of the second channel layer 18 in the first direction D1. The read bit line 21 extends in a third direction D3 and continuously connects the multiple third source-drain electrodes 19 spaced apart in the third direction D3. The write bit line 15 extends in the third direction D3 and continuously connects the multiple first source-drain electrodes 11 spaced apart in the third direction D3. The third direction D3 is a direction perpendicular to the top surface of the substrate 60.

Figure 6P:
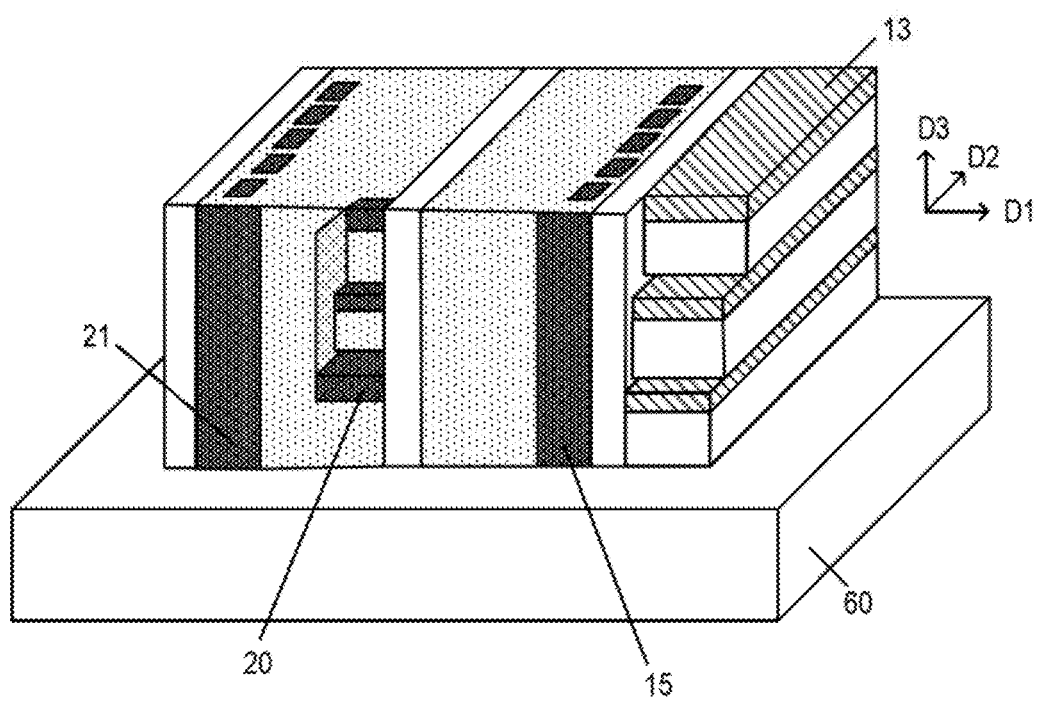
Figure 6Q:
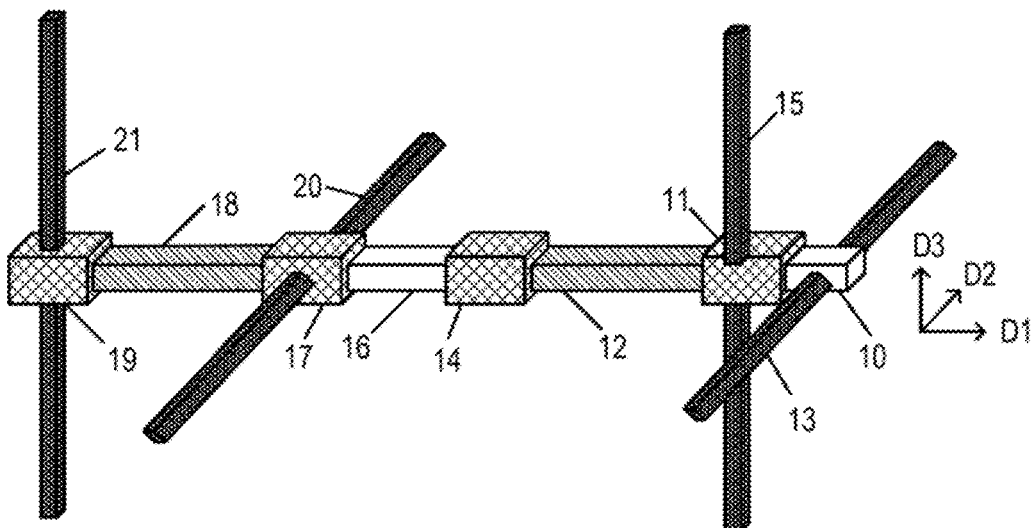

A write word line 13 is formed in the third part 63 and a portion of the first part 61 connected to the third part 63 in the second direction D2, and the write word line 13 is connected to the first gate electrode 10, as shown in FIGS. 6P and 6Q. FIG. 6Q is a schematic diagram of a connection structure of a storage transistor and a switching transistor in a memory cell.

For example, after forming the second source-drain electrode 14, an oxide material (e.g. silicon dioxide) is backfilled into the storage area P2 and the switching area P1. Next, a portion of the second filling layer is removed using, for example, a photoetching process, to expose a portion of the second channel layer 18 and a portion of the first channel layer 12, and a conductive material such as metal tungsten or TiN is deposited on the surface of the exposed second channel layer 18 and the surface of the exposed first channel layer 12 to form the first source-drain electrode 11, the third source-drain electrode 19, the read bit line 21, and the write bit line 15. Then, the support frame 66 covering the third part 63 and a portion of the first part 61 connected to the third part 63 in the second direction D2 is removed, for example, using a photoetching process, to expose the semiconductor layer 83. The exposed semiconductor layer 83 is etched to form multiple write word lines 13, and end portions of the multiple write word lines 13 spaced apart in the third direction D3 form a staircase structure (in two write word lines 13 adjacent in the third direction D3, the write word line close to the substrate 60 extends beyond the other write word line away from the substrate in the second direction D2).

It is to be noted that the semiconductor structure formed according to the above method includes a horizontal write word line structure, a horizontal read word line structure, a vertical write bit line structure, and a vertical read bit line structure (as shown in FIG. 6Q). It is to be understood that the above method may be appropriately adjusted, such that the formed semiconductor structure may include a vertical write word line structure, a vertical read word line structure, a horizontal write bit line structure, and a horizontal read bit line structure (as shown in FIG. 1).

The embodiments of the disclosure provide a semiconductor structure and a method for forming the semiconductor structure. A switching transistor and a storage transistor arranged in a horizontal direction are disposed in a memory cell, the charging and discharging of the storage transistor is controlled through the switching transistor to write information to the storage transistor, and the information is stored and read through the storage transistor, thereby eliminating the need for a capacitor structure in the memory cell, the volume of the memory cell can be reduced, and the storage density of a memory can be increased. In addition, in some embodiments of the disclosure, the first channel layer in the switching transistor coats a portion of the first gate electrode, and the second channel layer in the storage transistor coats a portion of the second gate electrode, i.e. the switching transistor and the storage transistor in the memory cell both have a channel all around structure, so that the size of the memory cell can be further reduced, thereby increasing the storage density of the semiconductor structure.

Described above are merely preferred implementations of the disclosure. It is to be noted that a number of modifications and refinements may be made by those of ordinary skill in the art without departing from the principles of the disclosure, and such modifications and refinements are also considered to fall within the scope of protection of the disclosure.

What is claimed is:

1. A method for forming a semiconductor structure, comprising:

providing a substrate; and forming a switching transistor and a storage transistor on a top surface of the substrate, wherein the switching transistor comprises a first gate electrode, a first channel layer coating a portion of the first gate electrode, and a first source-drain electrode and a second source-drain electrode both covering a surface of the first channel layer, the first source-drain electrode and the second source-drain electrode are distributed at two opposite ends of the first channel layer in a first direction, the first gate electrode extends in the first direction, the storage transistor comprises a second gate electrode, a second channel layer coating a portion of the second gate electrode, and a third source-drain electrode and a fourth source-drain electrode both covering a surface of the second channel layer, the third source-drain electrode and the fourth source-drain electrode are distributed at two opposite ends of the second channel layer in the first direction, the second gate electrode extends in the first direction, a portion of the second gate electrode extending out of the second channel layer in the first direction is electrically connected to the second source-drain electrode, the storage transistor is configured to store charge, and the first direction is a direction parallel to the top surface of the substrate.

2. The method for forming the semiconductor structure of claim 1, wherein forming the switching transistor and the storage transistor on the top surface of the substrate comprises:

forming a layer stack on the top surface of the substrate, wherein the layer stack comprises a plurality of semiconductor layers spaced apart in a direction perpendicular to the top surface of the substrate;

forming a support frame covering a portion of each of the plurality of semiconductor layers, wherein the support frame separates the layer stack into a switching area and a storage area arranged in the first direction, a portion of the semiconductor layer in the switching area serves as the first gate electrode, and a portion of the semiconductor layer in the storage area serves as the second gate electrode;

depositing a channel material on the first gate electrode and the second gate electrode to form the first channel layer coating the first gate electrode and the second channel layer coating the second gate electrode; and forming the second source-drain electrode covering the surface of the first channel layer, the second source-drain electrode being connected to the second gate electrode.

3. The method for forming the semiconductor structure of claim 2, wherein forming the layer stack on the top surface of the substrate comprises:

alternately depositing a first sacrificial layer and the semiconductor layer on the top surface of the substrate to form the layer stack;

etching the layer stack to form a first part, and a second part and a third part both protruding from a side wall of the first part in a second direction, the second direction being a direction parallel to the top surface of the substrate, and the second direction intersecting the first direction; and forming a plurality of first trenches penetrating through the first part, wherein the plurality of first trenches separate each of the plurality of semiconductor layers into a plurality of active strips spaced apart in the second direction.

4. The method for forming the semiconductor structure of claim 3, wherein forming the support frame covering a portion of each of the plurality of semiconductor layers comprises:

defining the switching area and the storage area in the layer stack, such that the third part is located at a side of the switching area away from the storage area and the second part is located at a side of the storage area close to the switching area;

forming a second sacrificial layer filling the plurality of first trenches and a gap between the second part and the third part;

removing the second sacrificial layer at an end portion of the storage area adjacent to the switching area, to expose a portion of each of the plurality of active strips; and forming the support frame covering a surface of the exposed portion of the active strip.

5. The method for forming the semiconductor structure of claim 4, wherein forming the first channel layer coating the first gate electrode and the second channel layer coating the second gate electrode comprises:

removing the layer stack and the second sacrificial layer which are located at an end portion of the switching area adjacent to the support frame to form a second trench exposing the substrate;

forming a third sacrificial layer filling the second trench;

removing the first sacrificial layer and the second sacrificial layer to expose the portion of the first gate electrode and the portion of the second gate electrode;

forming a first gate electrode dielectric layer covering the exposed portion of the first gate electrode and a second gate electrode dielectric layer covering the exposed portion of the second gate electrode;

removing the third sacrificial layer to expose an end portion of the second gate electrode located in the support frame;

implanting second doped ions into the exposed end portion of the second gate electrode; and depositing a channel material on the first gate electrode and the second gate electrode to form the first channel layer coating the first gate electrode and the second channel layer coating the second gate electrode, the first channel layer being in contact with the end portion of the second gate electrode implanted with the second doped ions.

6. The method for forming the semiconductor structure of claim 5, further comprising:

before forming the second source-drain electrode covering the surface of the first channel layer, depositing a conductive material on a portion of the surface of the second channel layer and a surface of the second part in the storage area, to form the fourth source-drain electrode and a read word line extending in the second direction and successively connecting a plurality of fourth source-drain electrodes.

7. The method for forming the semiconductor structure of claim 5, further comprising:

after forming the second source-drain electrode covering the surface of the first channel layer, forming the first source-drain electrode, the third source-drain electrode, a read bit line, and a write bit line, wherein the read bit line extends in a third direction and continuously connects a plurality of third source-drain electrodes spaced apart in the third direction, the write bit line extends in the third direction and continuously connects a plurality of first source-drain electrodes spaced apart in the third direction, and the third direction is a direction perpendicular to the top surface of the substrate; and forming a write word line in the third part and a portion of the first part connected to the third part in the second direction, the write word line being connected to the first gate electrode.

*    *    *    *    *